United States Patent [19]

Yoshikawa et al.

[11] Patent Number: 5,356,830
[45] Date of Patent: Oct. 18, 1994

[54] SEMICONDUCTOR DEVICE AND ITS MANUFACTURING METHOD

[75] Inventors: Susumu Yoshikawa; Shuichi Samata, both of Yokohama; Satoshi Maeda, Ooita; Shizuo Sawada, Yokohama, all of Japan

[73] Assignee: Kabushiki Kaisha Tobshiba, Kawasaki, Japan

[21] Appl. No.: 627,922

[22] Filed: Dec. 17, 1990

Related U.S. Application Data

[63] Continuation of Ser. No. 406,591, Sep. 13, 1989, abandoned.

[30] Foreign Application Priority Data

Sep. 19, 1988 [JP] Japan ................. 63-234317

[51] Int. Cl.⁵ ......................................... H01L 21/20
[52] U.S. Cl. .................................. 437/89; 437/191; 437/233; 437/48; 437/52
[58] Field of Search ............ 437/89, 191, 233, 48, 437/52, 193, ; 148/DIG. 11, DIG. 21; 357/59, 23.6

[56] References Cited

U.S. PATENT DOCUMENTS

| | | | |
|---|---|---|---|
| 4,141,765 | 2/1979 | Druminski | 156/612 |
| 4,438,728 | 3/1984 | Cannella et al. | 437/233 |
| 4,497,683 | 2/1985 | Celler et al. | 437/112 |
| 4,703,554 | 11/1987 | Havemann | 437/191 |
| 4,707,457 | 11/1987 | Erb | 437/193 |
| 4,722,908 | 2/1988 | Burton | 437/191 |
| 4,749,441 | 6/1988 | Christenson et al. | 437/90 |
| 4,754,313 | 6/1988 | Takemae et al. | 357/23.6 |
| 4,772,570 | 9/1988 | Kanai et al. | 437/109 |
| 4,786,615 | 11/1988 | Liaw et al. | 437/90 |
| 4,824,799 | 4/1989 | Komatsu | 437/89 |
| 4,882,299 | 11/1989 | Freeman et al. | 437/233 |
| 5,021,357 | 6/1991 | Taguchi et al. | 437/60 |

FOREIGN PATENT DOCUMENTS

| | | | |
|---|---|---|---|
| 0145577 | 12/1978 | Japan | 437/109 |
| 60-126814 | 11/1985 | Japan | . |
| 0063013 | 4/1986 | Japan | 437/90 |
| 0063015 | 4/1986 | Japan | 437/90 |
| 60-234312 | 4/1986 | Japan | . |
| 61-63015 | 8/1986 | Japan | . |
| 0021210 | 1/1987 | Japan | 437/191 |
| 62-37960 | 2/1987 | Japan | 437/52 |
| 0038252 | 2/1988 | Japan | 437/52 |
| 1-149452 | 6/1989 | Japan | 437/52 |

OTHER PUBLICATIONS

Crabbe et al., Mat. Res. Soc. Symp. Proc., vol. 106, Materials Research Society (1988), pp. 247–252.

Extended Abstracts of the 18th (1986 International) Conference on Solid State Devices and Materials, pp. 713–714, Tokyo, Japan; L. Karapiperis et al., "Selective Epitaxial Growth of Si and in Situ Deposition of Amorphous- or Poly-Si for Recrystallization Purposes".

Extended Abstracts/Electrochemical Society, vol. 87-2, 1987, abstract 1086, pp. 1512–1513, Princeton, N.J., U.S.; A. S. Yue et al., "Growth Mechanism of Episilicon Film on SiO₂ Surface".

*Primary Examiner*—Mary Wilczewski
*Attorney, Agent, or Firm*—Finnegan, Henderson, Farabow, Garrett & Dunner

[57] ABSTRACT

A semiconductor device and its manufacturing method are provided in which an epitaxial silicon layer is formed by a selective epitaxial growth method over a semiconductor substrate and a polysilicon layer is formed by an ordinary deposition method on the epitaxial silicon layer and these layers and are formed over a semiconductor device in a continuous process within the same furnace for a CVD apparatus.

14 Claims, 8 Drawing Sheets

SEMICONDUCTOR DEVICE AND ITS MANUFACTURING METHOD

This application is a continuation of application Ser. No. 07/406,591, filed Sep. 13, 1989, now abandoned.

BACKGROUND OF THE INVENTION

1. Field of the Invention

The present invention relates to a semiconductor device and its manufacturing method and, in particular, to a semiconductor device and its manufacturing method in which, in the process of forming a contact between an impurity concentration layer formed in a semiconductor substrate and a polysilicon layer formed over the impurity concentration layer and the process of forming a contact between a conductive layer formed over the semiconductor substrate and a polysilicon layer formed over the conductive layer, the polysilicon layer being vapor-phase grown by a selective epitaxial growth (SEG) method in their contact hole.

2. Description of the Related Art

A conventional semiconductor device and its method of manufacture using a selective epitaxial growth (SEG) method for selectively vapor-phase growing a silicon layer 5 only in a hole of a contact between an impurity diffusion layer formed in a semiconductor substrate and an overlying polysilicon layer and a contact between a conductive layer formed over the semiconductor substrate and an overlying polysilicon layer will be explained below with reference to FIG. 4.

Figure 4A:
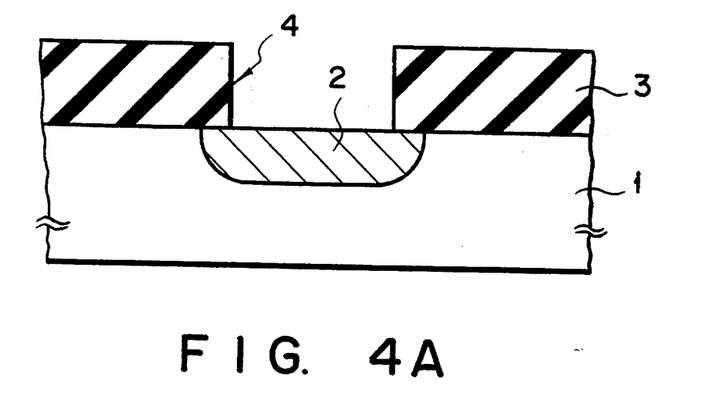
FIGS. 4A to 4C are cross-sectional views showing the steps of manufacturing a conventional semiconductor device.
Figure 4B:
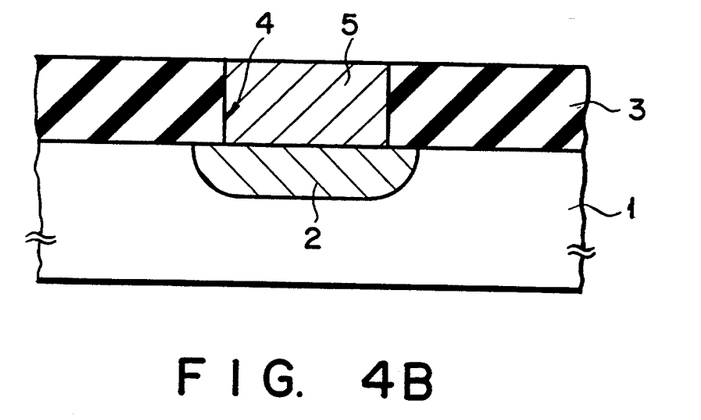
Figure 4C:
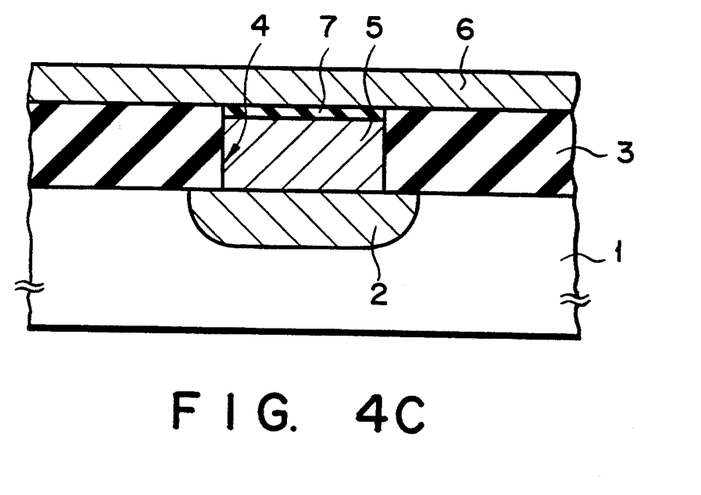

FIGS. 4A to 4C are cross-sectional views showing the steps of forming a semiconductor device using the SEG method whereby a silicon layer is formed.

In the step of FIG. 4A, an N-type impurity diffusion region pattern is formed in a P-type silicon semiconductor substrate 1 with the use of a photoresist, not shown. That is, with the photoresist as a mask, an N-type ion, such as arsenic, is implanted into the semiconductor substrate 1. Then, a silicon oxide film 3 of, for example, 6000 Å thick is deposited over the whole surface of the resultant structure by means of a chemical vapor deposition (CVD) method. A contact hole 4 is opened, by a reactive ion etching (RIE) method, in the silicon oxide film 3 so as to correspond to the N type impurity diffusion layer.

In the step of FIG. 4B, an epitaxial silicon layer 5 (hereinafter referred to as an SEG silicon layer) is selectively formed, by the SEG method, in the contact hole 4 at which time the SEG silicon layer 5 is of a single crystal type.

In the step shown in FIG. 4C, a polysilicon layer 6 is deposited over the whole surface of the resultant structure, for example, by means of the CVD method, followed by the formation of a predetermined pattern. By so doing, a semiconductor device is manufactured in which the SEG silicon layer 5 is formed between the N-type impurity diffusion layer 2 and the CVD polysilicon layer 6.

However, a native oxide film 7 is formed at an interface of the SEG silicon layer 5 in the contact hole and the CVD polysilicon layer, as shown in FIG. 4C. Since the SEG silicon layer 5 and CVD polysilicon layer 6 are formed by the different steps, a wafer needs to be transferred from an SEG furnace to a CVD furnace. At this time, these furnaces are opened, allowing $O_2$ in the outer atmosphere to enter into the CVD furnace at the latter step and a thermal oxide film (hereinafter referred to a native oxide) is formed on the surface of the wafer through a reaction with $O_2$ under the furnace heat. A native oxide film 7 is also formed on the upper surface portion of the SEG silicon film 5. Therefore, there is an increase in a contact resistance between the SEG silicon layer 5 and the CVD polysilicon layer 6.

SUMMARY OF THE INVENTION

An object of the present invention is to provide a semiconductor device and its manufacturing method in which, in the process of a contact between an epitaxial silicon layer formed by an SEG method on a substrate in the manufacture of a semiconductor device and a polysilicon layer formed over the epitaxial silicon layer, a connection of their layers can be achieved without producing any native oxide film at their interface which may cause a contact resistance.

That is, an object of the present invention is to provide a semiconductor device and its manufacturing method in which the formation of an epitaxial silicon layer by an SEG method on a semiconductor substrate and formation of a polysilicon layer on the polysilicon layer can be continuously achieved in the same furnace for a CVD apparatus, by the switching of a feed gas for polysilicon gas-phase growth by another, without producing any native oxide film at an interface between these two layers.

According to the present invention, the aforementioned two layers and are formed in a continuous process within the same furnace for a CVD apparatus in the manufacture of a semiconductor device, thus obviating the need to effect a furnace change for another treatment and hence avoiding the formation of a native oxide film on the surface of the layer due to its exposure to an outer atmosphere. It is, therefore, possible to prevent degradation of circuit characteristics which might otherwise occur due to a contact resistance resulting from a native oxide film which is formed during furnace change for another treatment during the manufacture of a semiconductor substrate.

DETAILED DESCRIPTION OF THE PREFERRED EMBODIMENT

A method for manufacturing a semiconductor device will be explained below with reference to FIGS. 1, 5 and 6.

Figure 5:
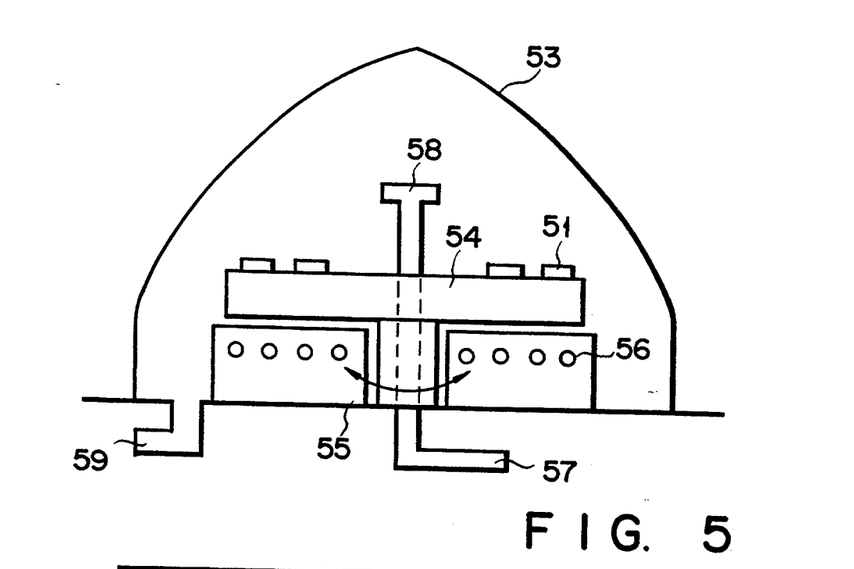
FIG. 5 is a diagrammatic view showing a furnace for a CVD apparatus which is used in the manufacture of the semiconductor device of the present invention.
Figure 6A:
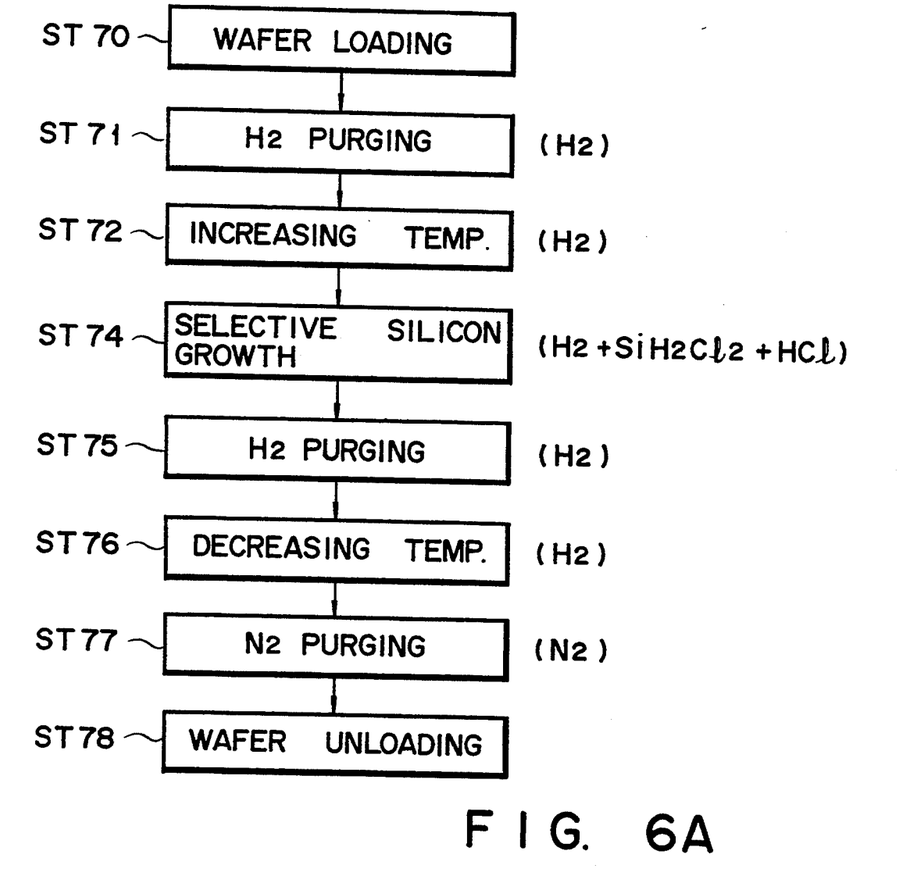
FIG. 6A is a flow chart showing a manufacturing process of a semiconductor device in a CVD apparatus which is not according to the present invention.
Figure 6B:
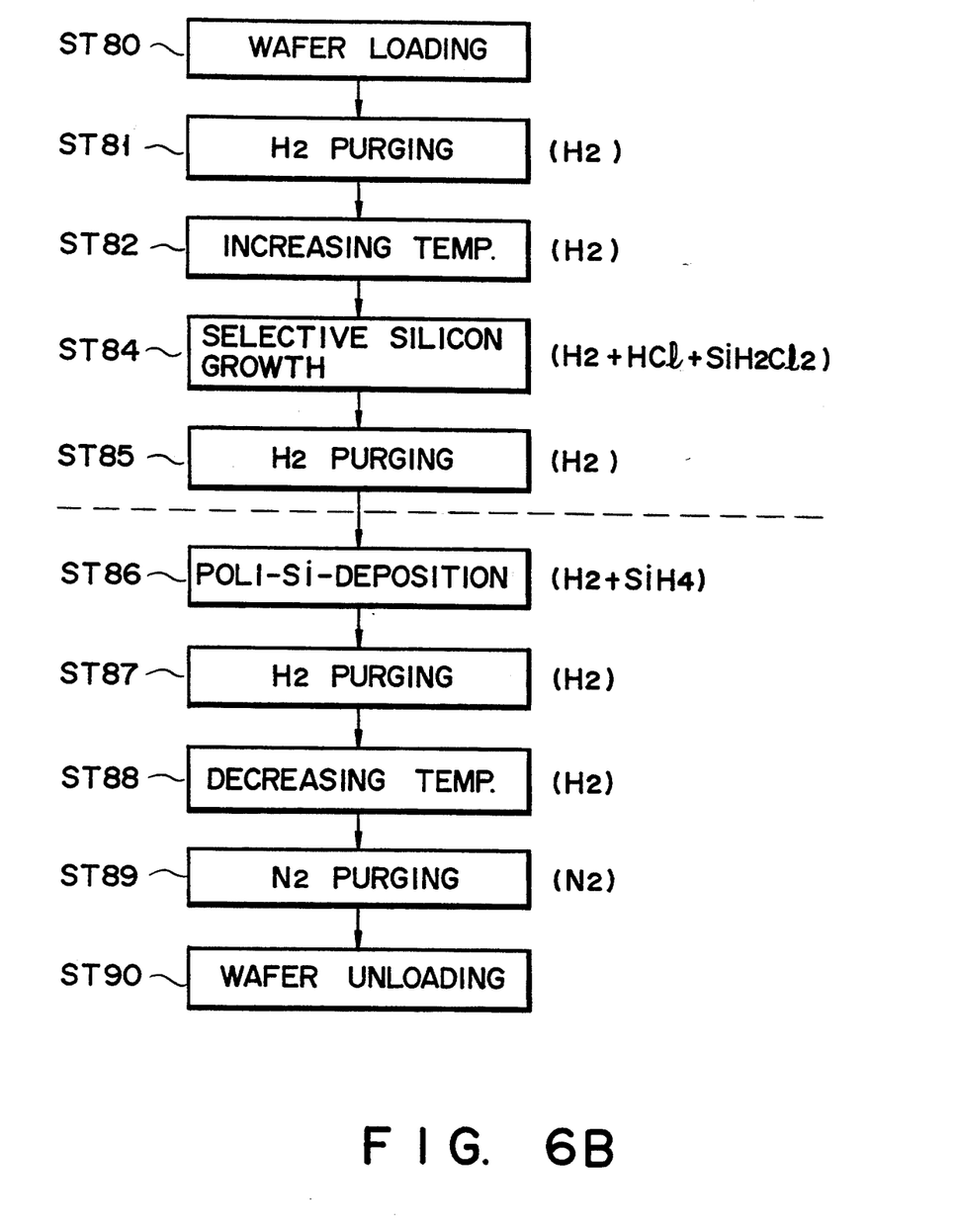
FIG. 6B is a flow chart showing a manufacturing process of a semiconductor device in a CVD apparatus which is according to the present invention.

FIG. 5 shows one form of a furnace for a CVD apparatus which is used in the manufacture of a semiconductor device. Reference numeral 51 represents a silicon wafer including a semiconductor substrate to be treated in the furnace; 53, a quartz bell jar which constitutes an outer wall of the furnace; 54, a wafer susceptor; 55, a susceptor rotation shaft; 56, a heat-up work coil; 57, a reaction gas inlet pipe; 58, a quartz nozzle; and 59, an exhaust pipe.

A process not used in the present invention will be explained below by referring to FIG. 6A.

First a wafer is loaded into a furnace 53 at step ST70. Then a $H_2$ gas is flowed into the furnace 53 via the reaction gas inlet tube 57 and quartz nozzle 58 to purge the furnace with air at step ST71. The furnace temperature is increased by the work coil 56, while an $H_2$ gas flows across the furnace at step ST72. After the furnace temperature rises to a predetermined level, an HCl gas is flowed across the furnace 53, etching away a native oxide film with HCl. Then a desired amount of reaction gas $SiH_2Cl_2$ is flowed across the furnace via the reaction tube 57 to allow a selective growth of an epitaxial silicon layer 5 at step ST74. After the silicon layer 5 is selectively grown to a desired level, the flow of HCl and $SiH_2Cl$ is stopped and an $H_2$ gas alone is flowed across the furnace for purging at step ST75. The furnace temperature is decreased in the $H_2$ gas atmosphere at step ST76. After the $H_2$ gas is replaced with $N_2$ gas, the furnace is purged with the $N_2$ gas at step ST77 and the flow of the gas into the furnace is stopped. The wafer thus treated is unloaded out of the furnace 53 at step ST78. Then a polysilicon layer 6 is deposited on the silicon layer at another furnace.

The process of the present invention will now be explained below with reference to FIG. 6B.

A wafer 51 is loaded into a furnace 58 at step ST80. After the purging of the furnace 53 with an $H_2$ gas at step ST81, the furnace temperature is increased in a stream of the $H_2$ gas at step ST82. The furnace temperature is increased by the work coil 56 to a desired level. An HCl gas is flowed into the furnace via the reaction gas inlet pipe 57 to etch away a native oxide film over the wafer. Then a gas $SiH_2Cl_2$ is introduced into the furnace to allow selective growth of an epitaxial silicon layer 5 at step ST84. The flow of a $HCl/SiH_2C_2$ mixed gas is stopped. The furnace is purged with an $H_2$ gas at step ST85 at which time a temperature rise is effected, noting that the process as set out above constitutes no feature of the present invention.

After the furnace is fully purged, a gas $SiH_4$ is flowed into the furnace 53, allowing a polysilicon layer 6 to be deposited on a resultant semiconductor structure at step ST86. The polysilicon layer is deposited to a desired thickness and a flow of an $SiH_4$ gas into the furnace is stopped. Then the furnace 53 is purged with an $H_2$ gas at step ST87. After a lowering of the furnace temperature at a step ST88, the furnace is purged with an $N_2$ gas and a treated wafer is unloaded out of the furnace at step ST90.

If the process of the present invention is not adopted, the polysilicon layer 6 which is selectively grown as set forth above is formed at another furnace, allowing a native oxide film to be produced at an interface between the selectively grown silicon layer 5 and the polysilicon layer 6. If such native oxide film is formed there, a resistive component is produced at a resultant semiconductor structure even if no native oxide film is formed at an interface between the silicon substrate 1 and the selectively grown silicon layer 5. This exercises a bad influence over the circuit characteristics of the semiconductor device.

According to the present invention, the polysilicon layer 6 is deposited over the semiconductor structure within a common furnace 53. Thus, no native oxide film is formed at an interface between the selectively grown silicon layer 5 and the polysilicon layer 6, thus preventing the degradation of the circuit characteristics resulting from the generation of a resistive component.

The relation of the native oxide film to the contact resistance will be explained below with reference to a graph of FIG. 7.

Figure 7:
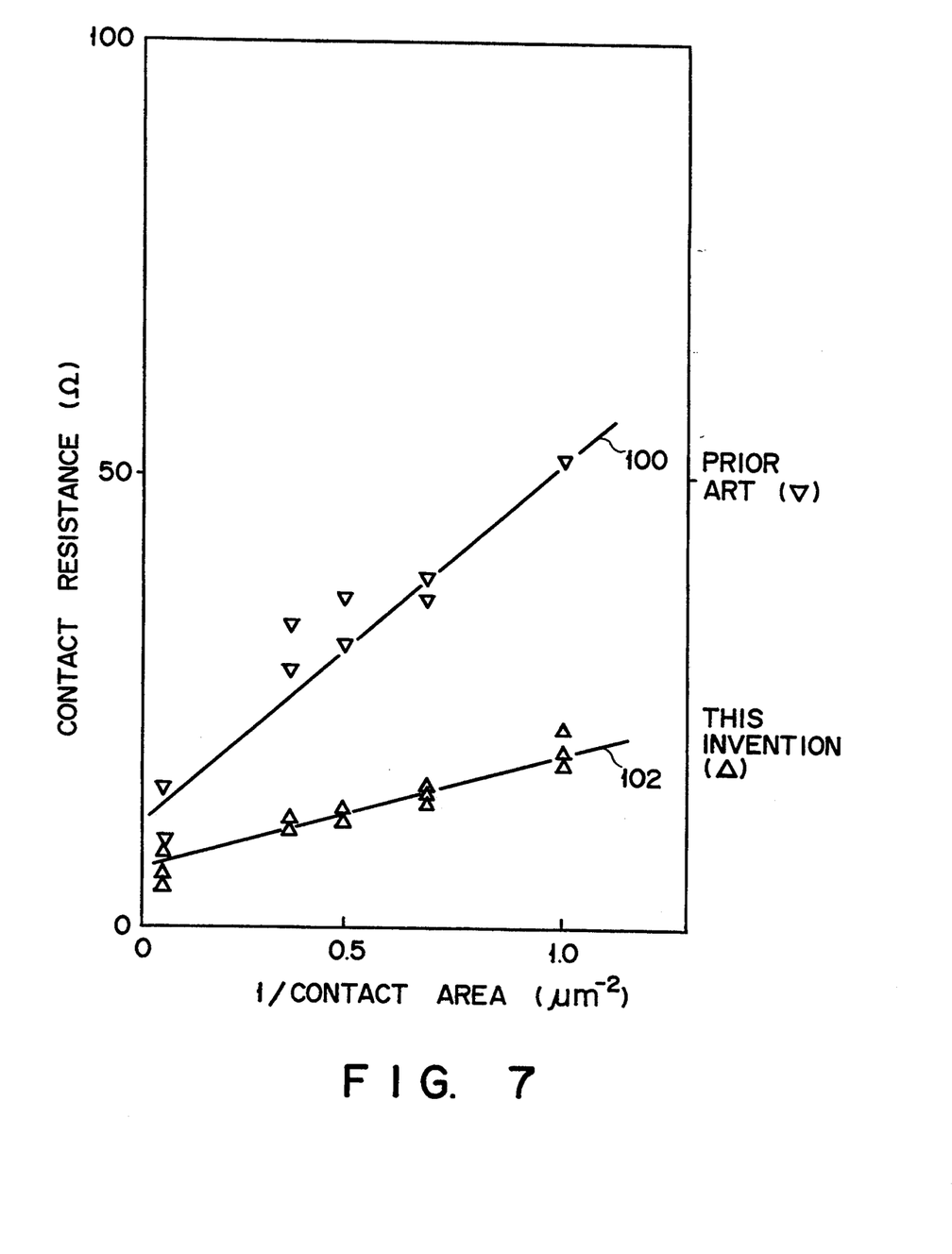
FIG. 7 is a graph showing a contact-area-to-contact-resistance relation of the respective layers of the conventional semiconductor device and a semiconductor device of the present invention.

The graph of FIG. 7 shows a relation between an area of a connection of the epitaxial silicon layer 5 and polysilicon layer 6 on one hand and the resistive value of a contact surface on the other hand. In the graph shown, the lines 100 and 102 represent the characteristic curves of the prior art device and the device of the present invention, respectively. From the graph of FIG. 7 it will be seen that, since the respective layers as set forth above are formed within the common furnace for the CVD apparatus in accordance with the present invention, no native oxide film is produced in the semiconductor structure and hence the contact resistance is reduced to one half that of the conventional semiconductor device and less.

Then, the semiconductor device of the present invention and its manufacturing method will be explained below with reference to FIGS. 1 to 3.

A semiconductor device (first embodiment) of the present invention and its manufacturing method will be explained below with reference to FIGS. 1A to 1C.

Figure 1A:
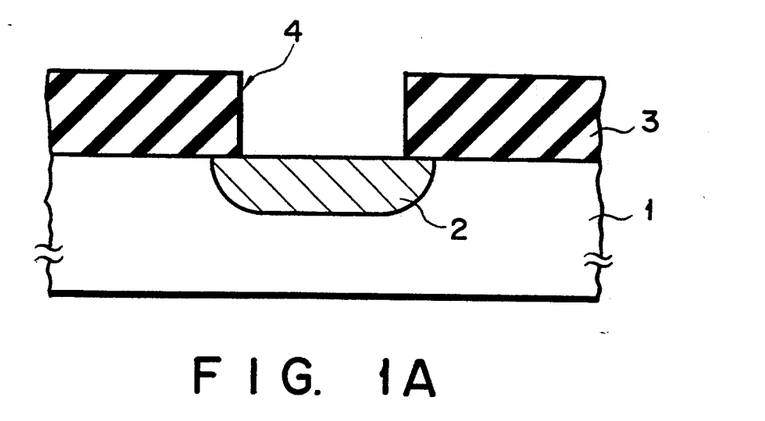
FIGS. 1A to 1C are cross-sectional views showing the steps of manufacturing a semiconductor device according to one embodiment of the present invention.
Figure 1B:
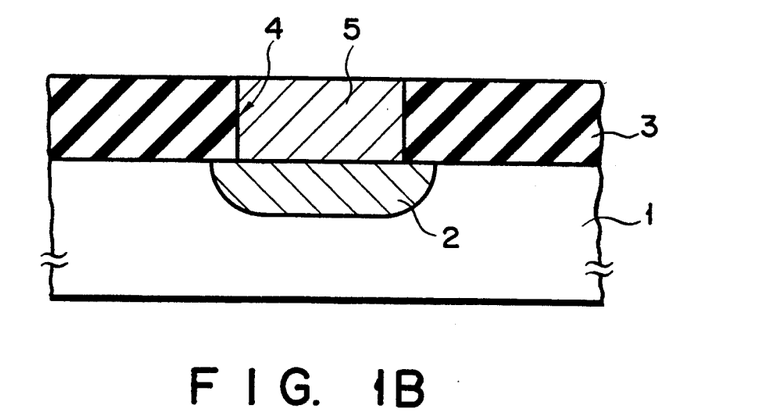

In FIG. 1A, an N type impurity diffusion area pattern is formed on a P type silicon semiconductor substrate 1 with the use of a photoresist, not shown. With the photoresist as a mask an N type ion, such as As, is implanted into the semiconductor substrate to form an N type impurity diffusion layer 2. A silicon oxide film 3 of, for example, 6000 Å is deposited by a CVD method on the whole surface of a resultant semiconductor structure. A contact hole 4 is opened by a reactive ion etching (RIE) method in the silicon oxide film so as to correspond to the N type impurity diffusion layer 2.

As seen from FIG. 1B, an epitaxial silicon layer 5 (hereinafter referred to as an SEG silicon layer) is selectively vapor-phase deposited in the contact hole to a thickness of 6000 Å at a temperature of 900° C. and pressure of 50 Torrs with the use of a feed gas of $SiH_2C_2+HC+H_2$. In this case, the SEG silicon layer 5 thus deposited is of a single crystal type.

Figure 1C:
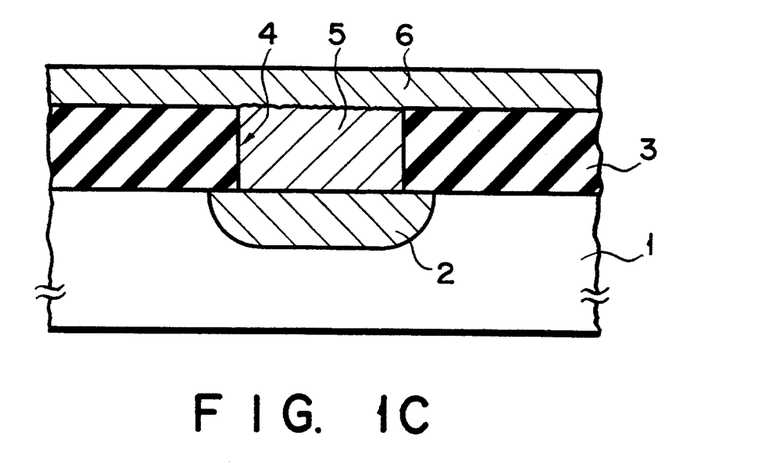

In FIG. 1C, in the same furnace as that in which the SEG has been performed, a polysilicon layer 6 is vapor-phase grown on the SEG silicon layer 5 and silicon oxide film 3 at which time a gas $Si_2H_6$ or $SiH_4$ is used in place of the feed gas $SiH_2C_2+HC+H_2$. Then an N type impurity ion, such as arsenic, is implanted in a low dose of, for example, $10^{11}$ to $10^{13}$ cm$^{-2}$ into the SEG silicon layer 5 and polysilicon layer 6 and, with the photoresist as a mask, the polysilicon layer 6 is patterned by a photoetching method to a predetermined pattern, thus manufacturing a semiconductor device.

Though not shown in Figures, a metal such as aluminum, high melting point metal such as tungsten, or silicide such as tungsten silicide may be deposited on the polysilicon layer 6, followed by a patterning step to provide a predetermined pattern.

Although, in this embodiment, the N type impurity ion is implanted by the ion implantation method into the SEG silicon layer 5 and polysilicon layer 6, it may be doped into the SEG silicon layer 5 and polysilicon layer 6 during a vapor-phase growth in a stream of, for example, $AsH_3$.

Although, in the aforementioned embodiment, the N type impurity diffusion layer 2 is formed in the P type silicon semiconductor substrate 1, a P type impurity diffusion layer may be formed in an N type silicon semiconductor substrate.

According to the semiconductor device and its manufacturing method, the formation of the SEG silicon layer 5 and that of polysilicon layer 6 over the silicon oxide film 3 and SEG silicon layer 5 can be continuously achieved within the same furnace by simply switching one feed gas for silicon vapor-phase growth to another. By so doing, it is possible to prevent formation of a native oxide film which may be produced at these two silicon layers and hence to reduce a contact resistance across the SEG silicon layer 5 and the polysilicon layer 6 on the SEG silicon layer.

A semiconductor device (second embodiment) of the present invention and its manufacturing method will be explained below with reference to FIGS. 2A to 2C.

Figure 2A:
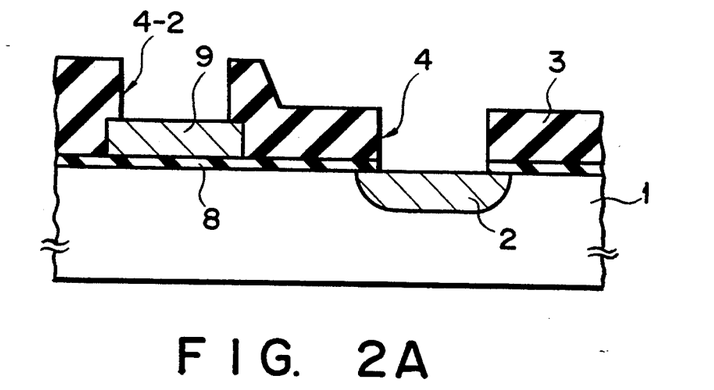
FIGS. 2A to 2C and 3A to 3G are cross-sectional views showing the steps of manufacturing a semiconductor device according to another embodiment of the present invention.
Figure 2B:
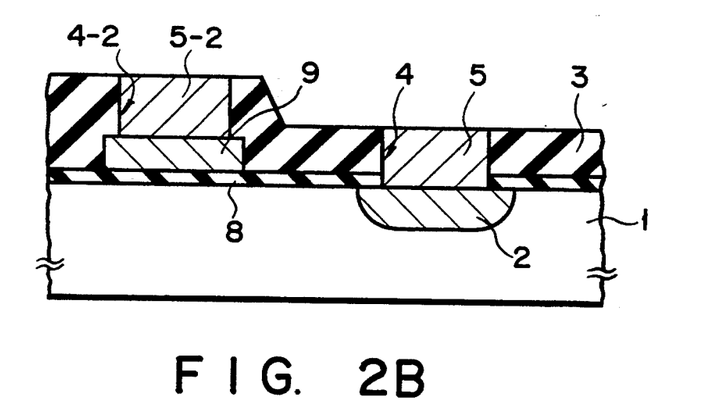

In a step shown in FIG. 2A, with the use of a photoresist not shown, an N type impurity diffusion area pattern is formed on a P type silicon semiconductor substrate 1. With the photoresist as a mask, an N type ion such as arsenic is implanted into the semiconductor substrate 1 to form an N type impurity diffusion layer 2. Then an oxide film 8 of, for example, 200 Å is formed by a thermal oxidation method on the silicon semiconductor substrate 1. Then a 3000 Å-thick polysilicon layer is deposited by the CVD method on the resultant semiconductor structure and an N type impurity ion such as arsenic is implanted into the polysilicon layer to make the polysilicon layer an N type. By the photoetching method using, for example, a photoresist, this N type polysilicon layer is patterned to a predetermined pattern to provide an N type polysilicon layer 9. Then a silicon oxide film 3 of, for example, 6000 Å is deposited by the CVD method over the resultant semiconductor structure. Then first and second contact holes 4 and 4-2 are opened by the RIE method in the oxide films 8 and 3 so as to correspond to the N type impurity diffusion layer 2 and N type polysilicon layer, respectively.

In the step shown in FIG. 2B, epitaxial silicon layers 5 and 5-2 (hereinafter referred to as SEG silicon layers) are selectively formed by the SEG method within the first and second contact holes 4 and 4-2, respectively, to a thickness of 6000 Å in a flow of $SiH_2C_2+HCl+H_2$ under a pressure of 50 Torrs at 900° C. At this time, the SEG silicon layer 5 (single crystal silicon) is grown on the N type impurity diffusion layer 2 within the first contact hole 4 and the SEG silicon layer 5-2 (polysilicon layer) is grown on the N type polysilicon layer 9 within the second contact hole 4-2. This difference is produced because, upon the growth of the SEG silicon in contact with the polysilicon, the SEG silicon becomes a polysilicon as opposed to a single crystal.

Figure 2C:
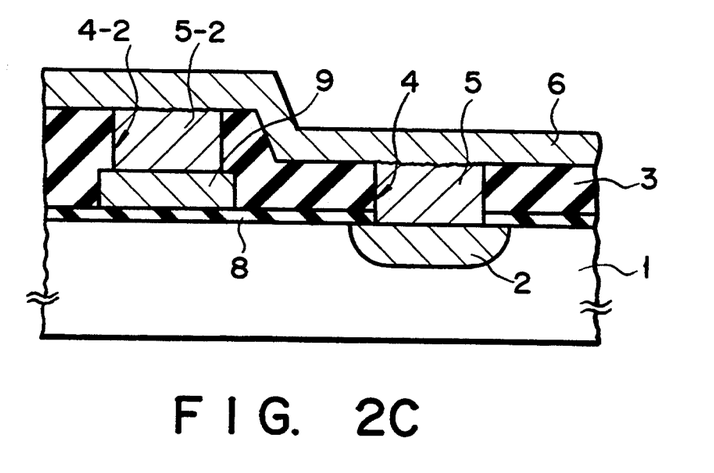

In the step shown in FIG. 2C, within the same furnace as that in which the aforementioned SEG has been effected, a polysilicon layer 6 is continuously vapor-phase grown on the SEG silicon layers 5, 5-2 and silicon oxide film 3 in a flow of a feed gas $Si_2H_6$ or $SiH_4$ with which the $SiH_2C_2+HC+H_2$ has been replaced. Then an N type impurity ion such as arsenic is doped in a low dose of, for example, $10^{11}$ to $10^{13}$ cm$^{-2}$ into the SEG silicon layers 5, 5-2 and polysilicon layer 6. By the photoetching method using, for example, a photoresist, the polysilicon layer 6 is patterned to a predetermined pattern, manufacturing a semiconductor device.

Though not shown in FIG. 2C, a metal such as aluminum, high melting point metal such as tungsten or silicide such as tungsten silicide may be deposited on the polysilicon layer 6, followed by a patterning step to a predetermined pattern on the multi-level polysilicon structure.

Although, in the aforementioned embodiment, the N type impurity ion is implanted into the SEG silicon layers 5, 5-2 and polysilicon layer 6, it may be doped into the SEG silicon layers 5 and 5-2 and polysilicon layer 6 during a growth of these layers in a flow of, for example, $AsH_3$ across the furnace.

Although, in the aforementioned embodiment, the N type impurity diffusion layer 2 is formed in the P type silicon semiconductor substrate 1, a P type impurity diffusion layer may be formed in the N type silicon semiconductor substrate.

According to the semiconductor device and its manufacturing method as set forth above, the SEG silicon layers 5, 5-2 and polysilicon layer 6 are continuously formed over the semiconductor substrate during a growth of these silicon layers in a flow of a substitute feed gas across the same furnace in which case the polysilicon layer 6 is formed on the SEG silicon layers 5, 5-2 and silicon oxide film 3. It is, therefore, possible to prevent the formation of a native oxide film which is produced at an interface of these layers and hence to reduce a contact resistance across the SEG silicon layers 5, 5-2 and the overlying polysilicon layer 6.

A third embodiment of the present invention will be explained below with reference to FIGS. 3A to 3G.

Figure 3A:
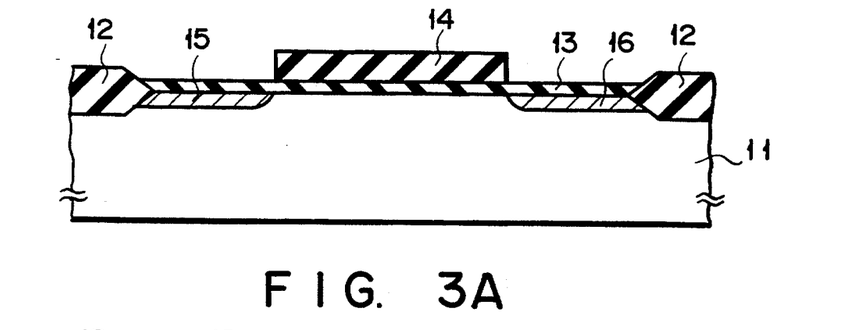

In a step shown in FIG. 3A, a device isolation field oxide film 12 is formed at the surface of a P type silicon semiconductor substrate 11 by means of, for example, an LOCOS method. Then a silicon oxide film 13 is formed by a thermal oxidation method on the surface of the P type semiconductor substrate 11. A mask 14 for an N type impurity diffusion area is formed on the silicon oxide film 13. With the mask 14 as the photoresist, an N type impurity ion such as arsenic is implanted into the semiconductor substrate 11 to form N type impurity diffusion layers 15, 16.

Figure 3B:
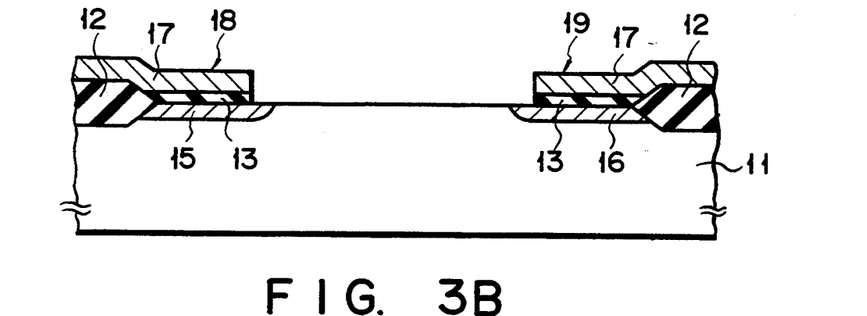

At the step shown in FIG. 3B, subsequent to removing the mask 14, a polysilicon layer 17 is deposited on a resultant structure by means of, for example, the CVD method. By a photoetching method using, for example, a photoresist, the polysilicon layer 17 and silicon oxide film 13 are patterned to provide capacitors 18, 19 composed of a polysilicon layer 17.

Figure 3C:
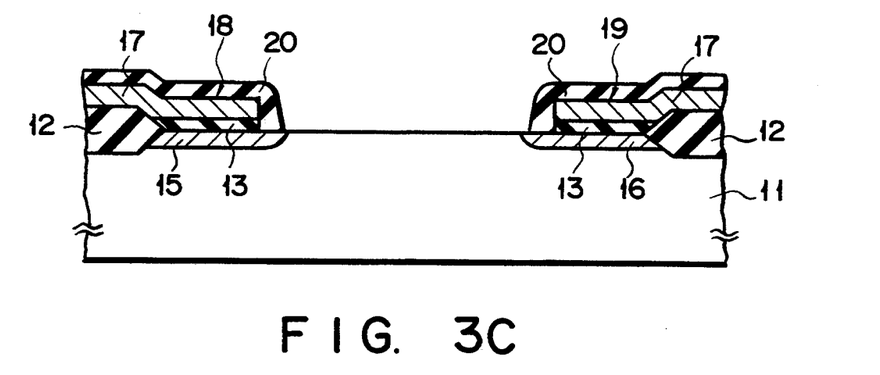

At the step shown in FIG. 3C, the polysilicon layer 17 (that is, the capacitor electrodes 18, 19) is oxidized by the thermal oxidation method to form a silicon oxide film 20. Then the silicon oxide film, not shown, on the surface of the substrate is removed to partially expose the surface of the semiconductor substrate 11.

Figure 3D:
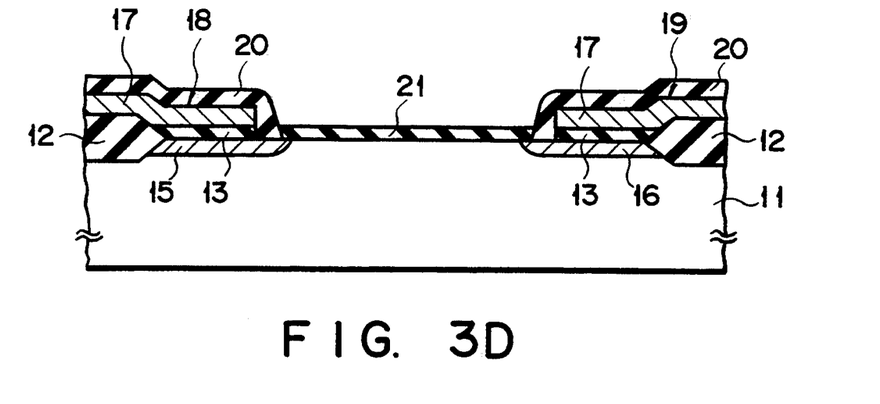

At the step shown in FIG. 3D, a silicon oxide film 21 is formed by the thermal oxidation method on the surface of the semiconductor substrate 11. The silicon oxide film provides a gate insulating film for a capacitor select MOS transistor and has a thickness of, for example, 200 Å.

Figure 3E:
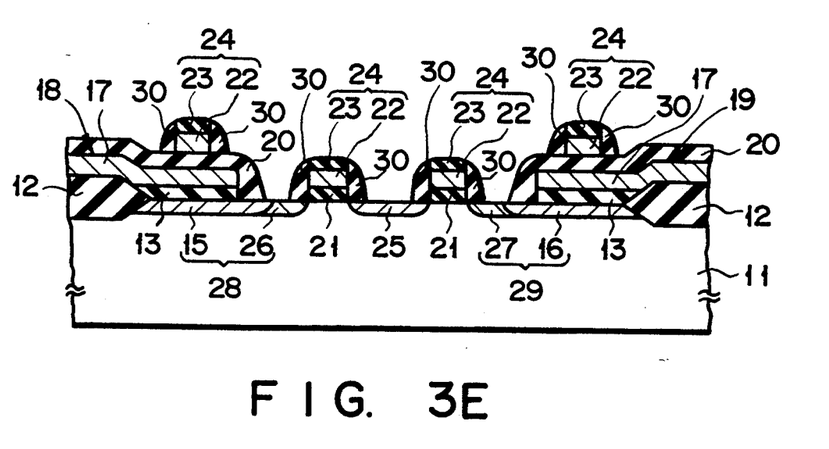

At the step shown in FIG. 3E, a polysilicon layer 22 is deposited on the resultant semiconductor structure by means of, for example, the CVD method. A silicon oxide film 23 is deposited on the surface of the resultant semiconductor structure by means of the CVD method. By the photoetching method using, for example, a photoresist, a superimposed layer, composed of the polysilicon layer 22 and silicon oxide film 23, is patterned to a predetermined pattern and a word line 24 is formed for the gate electrode of a capacitor select MOS transistor. With the word line 24 and polysilicon layer 17 as a mask, an N type impurity ion such as arsenic is implanted into the surface portion of the semiconductor substrate 11 to form an N type impurity diffusion region 25 for a drain region of the capacitor select MOS transistor as well as to form N type impurity diffusion source regions 26 and 27 which merge with the N type impurity diffusion regions 15 and 16, respectively. At this time, impurity diffusion layers 28 and 29 are formed in a manner to correspond to the N type impurity diffusion regions 15, 26 and 16, 27, respectively, for capacitors. Then a silicon oxide film is deposited by, for example, the CVD method on the surface of the resultant semiconductor structure and a reactive ion etching is performed on the semiconductor structure to leave the aforementioned silicon oxide film on the side wall of the gate electrode. A silicon oxide film 30 is formed on the side wall of the gate electrode 24 as shown in FIG. 3E.

Figure 3F:
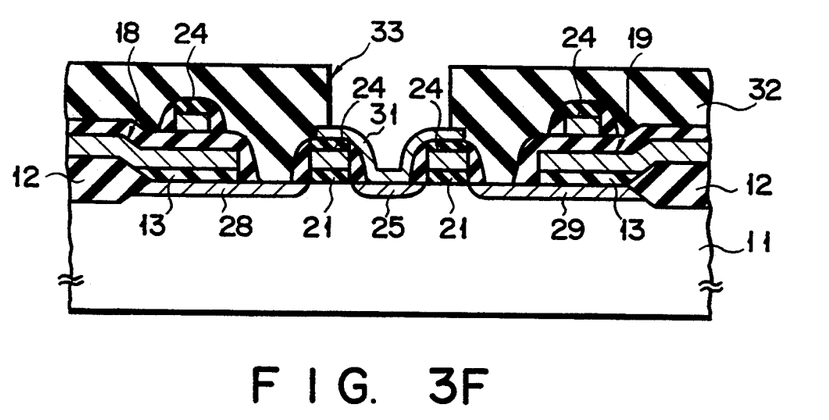

At the step shown in FIG. 3F, a polysilicon layer of, for example, 1000 Å is deposited by the CVD method on the whole surface of the semiconductor structure. Then the polysilicon layer is selectively removed using a predetermined mask, not shown, leaving the polysilicon layer 31 in a manner to cover the N type impurity diffusion layer 25 and adjacent word line 24. Then a low melting point glass film 32 such as BPSG (boron-phosphor-silicate glass) of, for example, 7000 Å is deposited on the resultant structure, followed by a heat treatment step and a step for planarization of the BPSG layer surface. With a predetermined mask, not shown used, the BPSG film 32 is selectively removed to open a contact hole 33 where the BPSG film 32 is exposed.

Figure 3G:
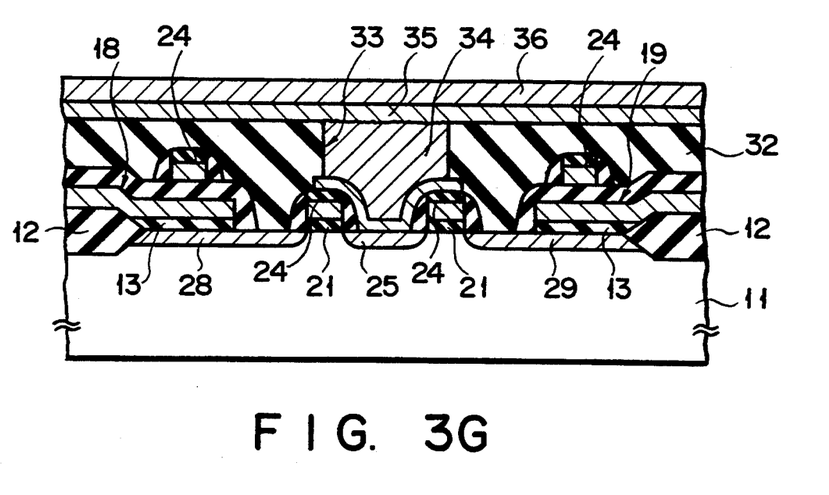

At the step shown in FIG. 3G, an epitaxial silicon layer 34 (hereinafter referred to as an SEG silicon layer) is selectively vapor-phase grown into the thus opened contact hole 33 at a pressure of 50 Torrs at 900° C. with the use of a feed gas of, for example, $SiH_2Cl_2 + HCl + H_2$. Since at this time the SEG silicon layer 34 is vapor-phase grown in contact with the polysilicon layer 31, it is deposited as a polysilicon layer. Within the same furnace as that in which the aforementioned SEG layer has been formed, a polysilicon layer 35 is continuously vapor-phase grown on the SEG silicon layer 34 and PBSG film 32 in a feed gas of $Si_2H_6$ or $SiH_4$ with which $SiH_2Cl_2 + HCl + H_2$ has been replaced. Then a silicide such as WSi (tungsten silicide) layer 36 is deposited on the polysilicon layer 35. By photoetching method using, for example, a photoresist, the polysilicon layer 35 and silicide layer 36 are patterned to a predetermined pattern to provide a two-level layer structure of the polysilicon layer 35 and silicide layer 36, that is, a bit line 37 of a polycide layer. A semiconductor device according to the third embodiment of the present invention is thus manufactured.

Although, in the aforementioned embodiment, the N type impurity diffusion layers 25, 28 and 29 are formed on the P type semiconductor substrate, P type impurity diffusion layers may be formed on the N type silicon semiconductor substrate.

According to this semiconductor device and its manufacturing method, after the contact hole 33 is opened relative to the N type impurity diffusion layer 25 which is situated between the adjacent gate electrodes, the polysilicon layer 31 is formed at least in a manner to cover the gate electrode 24 with such a requisite mask alignment allowance with which the contact hole 33 may be formed at any proper place over the polysilicon layer 31, eliminating the need to adopt a self-alignment structure. It is thus possible to enhance an integration density of a semiconductor device in a lateral direction. In the conventional semiconductor device, if a contact size is below a submicron level at the contact area, the drive speed of the semiconductor device is slowed down due to a rise in the contact resistance. According to the present invention, due to the presence of the polysilicon layer 31 a contact size can be increased to any proper size just over the polysilicon layer 31. Furthermore, the BPSG film 32 which is a low melting point glass is deposited on the whole surface of the semiconductor substrate and the surface of the resultant semiconductor substrate is planarized, preventing a "step" breakage at the bit line 35. It is also possible to continuously grow the aforementioned two layers, that is the SEG silicon layer 34 and polysilicon layer 35 on the silicon layer and BPSG film 32, simply by switching one feed gas for silicon vapor-phase growth to another. By so doing, a native oxide film is not created at the interface between the these two layers, reducing a contact resistance across the SEG silicon layer 34 and the overlying polysilicon layer 35. It is thus possible to provide a semiconductor device of a smaller contact resistance at an enhanced integration density.

In one variant, not shown, of the third embodiment, the way for forming the polysilicon layer 31 between the two adjacent gate electrodes 24 at least in a manner to cover these gate electrodes 24 may be implemented by an epitaxial vapor-growth method, not the CVD method. In the CVD method, oxygen which enters the CVD furnace thermally causes a reaction to form a native oxide film. In the epitaxial vapor-phase growth, no native oxide film is formed, further reducing a contact resistance.

According to this variant, if any native oxide film is formed at an interface between the diffusion layer and its overlaying silicon layer in the conventional semiconductor device, an ion implantation step is conducted at a high dose level, destroying that native oxide film. In this case, impurity diffusion layers in the semiconductor substrate are extended by such a high dose ion implantation step. Because of this extension, the impurity diffusion layers cause a shorting to occur relative to each other, failing to operate in normal way. Or there is a risk that the semiconductor device will be destroyed. Since, according to the first and second embodiments of the present invention, the silicon layer 5 or 5-2 is vapor-phase grown over the impurity diffusion layer 2, no native oxide film is formed at their interface and it is not necessary to perform a high dose ion implantation step to destroy such a native oxide film. Although in the course of the manufacture the impurity doping step is performed relative to the SEG polysilicon layers 5 and 5-2 and their overlying polysilicon layer 6, there is no such a problem as set forth above because the aforementioned doping step is effected at a low dose level.

In the variant of the third embodiment, if the polysilicon layer 31 is vapor-phase grown on the impurity diffusion layer 25, no native oxide film is formed at their interface. It is not necessary, therefore, to perform a high dose ion implantation step and hence to solve the extension of one impurity diffusion layer into an adjacent impurity diffusion layer.

According to the present invention, the SEG silicon layer is formed by the SEG method in the contact hole of the semiconductor structure and an overlying polysilicon layer is continuously formed in the same furnace as that in which the SEG silicon layer has been formed, preventing formation of a native oxide film at their interface. It is thus possible to reduce a contact resistance.

In the case where the impurity diffusion layer and its overlying silicon layer are formed by the phase growth method, no native oxide film is formed at their interface, obviating the need to perform a high dose ion implantation step which might otherwise be required in the conventional semiconductor device in order to destroy a native oxide film. According to the present invention, it is possible to avoid a shorting between the adjacent impurity diffusion layers and hence the failure of the device to operate in normal way. It is also possible to avoid the destruction of a semiconductor device.

What is claimed is:

1. A method for manufacturing a semiconductor device, comprising:
    forming an impurity diffusion layer in a semiconductor substrate, forming two gates separated by a predetermined interval over a surface of said substrate and forming a first insulating layer on each of said gates;
    forming a first polysilicon conductive layer on said first insulating layer, said first polysilicon conductive layer being connected to said impurity diffusion layer and extending on said first insulating layer a distance greater than said predetermined interval;
    forming a second insulating layer over an entire area of said surface of said substrate on which said gates are formed;
    forming in said second insulating layer a hole having a diameter larger than said predetermined interval between said gates;
    forming in said hole, by a selective epitaxial method, a second polysilicon conductive layer connected to said first polysilicon conductive layer, said selective epitaxial method being performed within a furnace of a chemical vapor deposition apparatus; and
    forming within said furnace by polysilicon deposition a third polysilicon conductive layer connected to said second polysilicon conductive layer,
    wherein said forming of the second polysilicon conductive layer and the third polysilicon conductive layer is continuously performed in a same furnace without exposure to an atmosphere outside the furnace and absent formation of an oxide film between the second and third polysilicon conductive layers.

2. The method of claim 1 wherein said furnace is cooled after forming said second polysilicon conductive layer therein.

3. The method of claim 1 wherein said forming of said hole in said second insulation layer includes use of a HCl feed gas.

4. The method of claim 1 wherein an interior of said furnace is purged with hydrogen gas prior to forming said second polysilicon conductive layer therein.

5. The method of claim 1 wherein, prior to forming said second polysilicon conductive layer, a silicon wafer having said semiconductor substrate is provided in said furnace.

6. The method of claim 5 wherein said silicon wafer is removed from said furnace subsequent to said forming of said third polysilicon conductive layer therein.

7. The method of claim 1 wherein an interior of said furnace is purged with nitrogen gas subsequent to said forming of said third polysilicon conductive layer therein.

8. A method for manufacturing a dynamic random access memory device, comprising:
    forming an impurity diffusion layer in a semiconductor substrate, forming two gates separated by a predetermined interval over a surface of said substrate to produce a field effect transistor for switching between bit lines and cells, with said gates being separated by a predetermined interval and forming an insulating layer on each of said gates;
    forming a first polysilicon conductive layer on said first insulating layer, said first polysilicon conductive layer being connected to said impurity diffusion layer and extending on said first insulating layer a distance greater than said predetermined interval;
    forming a second insulating layer over an entire area of the surface of said substrate on which said gates are formed;
    forming in said second insulating layer a hole having a diameter larger than said predetermined interval between said gates;
    forming in said hole, by a selective epitaxial growth method, a second polysilicon conductive layer connected to said first polysilicon conductive layer, said selective epitaxial growth method being performed within a furnace of a chemical vapor deposition apparatus; and
    forming within said furnace by polysilicon deposition a third polysilicon conductive layer, as a bit line of said dynamic random access memory device, connected to said second polysilicon conductive layer,
    wherein said forming of the second polysilicon conductive layer and the third polysilicon conductive layer is continuously performed in a same furnace without exposure to an atmosphere outside the furnace and absent formation of an oxide film between the second and third polysilicon conductive layers.

9. The method of claim 8 wherein said furnace is cooled after forming said second polysilicon conductive layer therein.

10. The method of claim 8 wherein said forming of said hole in said second insulation layer includes use of a HCl feed gas.

11. The method of claim 8 wherein an interior of said furnace is purged with hydrogen gas prior to forming said second polysilicon conductive layer therein.

12. The method of claim 8 wherein, prior to forming said second polysilicon conductive layer, a silicon wafer having said semiconductor substrate is provided in said furnace.

13. The method of claim 12 wherein said silicon wafer is removed from said furnace subsequent to said forming of said third polysilicon conductive layer therein.

14. The method of claim 8 wherein an interior of said furnace is purged with nitrogen gas subsequent to said forming of said third polysilicon conductive layer therein.

* * * * *